United States Patent [19]

Enz

[11] 4,343,038
[45] Aug. 3, 1982

[54] MAGNETIC BUBBLE DOMAIN STRUCTURE

[75] Inventor: Ulrich E. Enz, Eindhoven, Netherlands

[73] Assignee: U.S. Philips Corporation, New York, N.Y.

[21] Appl. No.: 183,502

[22] Filed: Sep. 2, 1980

[30] Foreign Application Priority Data

Sep. 28, 1979 [NL] Netherlands ......................... 7907217

[51] Int. Cl.³ ............................................. G11C 19/08
[52] U.S. Cl. ......................................... 365/36; 365/30
[58] Field of Search ....................... 365/32, 36, 39, 30; 427/130, 131, 132

[56] References Cited

U.S. PATENT DOCUMENTS

| | | | |
|---|---|---|---|
| 3,914,751 | 10/1975 | Keefe et al. ............................ | 365/36 |
| 3,996,573 | 12/1976 | Singh ..................................... | 365/36 |
| 4,171,408 | 10/1979 | de Leeow ............................. | 427/131 |

OTHER PUBLICATIONS

"Bubble Memories Come to the Boil," P.K. George et al, Electronics, Aug. 2, 1979, pp. 99-109.
"Contiguous-Disk Bubble Domain Devices," Y.S. Lin et al, IEEE Trans. on Magnetics, vol. MAG-13, No. 6, Nov. 1977, pp. 1744-1764.

Primary Examiner—James W. Moffitt
Attorney, Agent, or Firm—Marc D. Schechter

[57] ABSTRACT

A magnetic bubble domain structure comprising a bubble domain layer supported by a nonmagnetic substrate. A control layer is superimposed on the major surface of the domain layer which remote from the substrate. The control layer has an easy axis of magnetization in the plane which defines at least one bubble domain propagation path. The unique control layer according to the invention may be a garnet layer which comprises two sublayers: a first, continuous, sublayer, and a second, discontinuous, sublayer. The discontinuous sublayer defines the required propagation patterns. An advantage of the invention is that the in-plane rotary field to be applied for propagating the bubble domains can be considerably weaker than in bubble domain structures which are equipped with nickel-iron propagation patterns.

5 Claims, 6 Drawing Figures

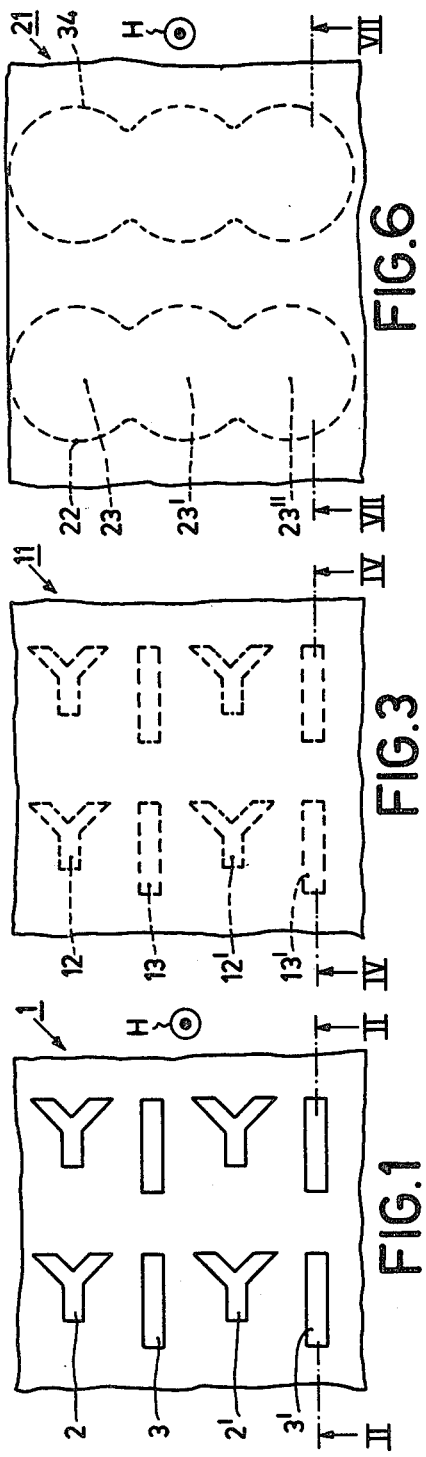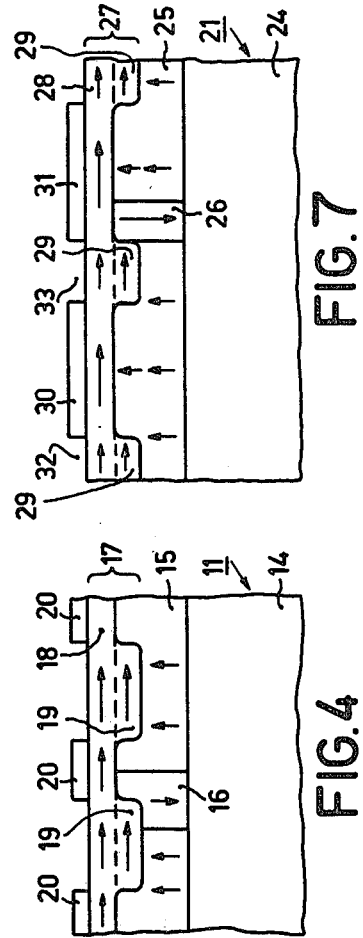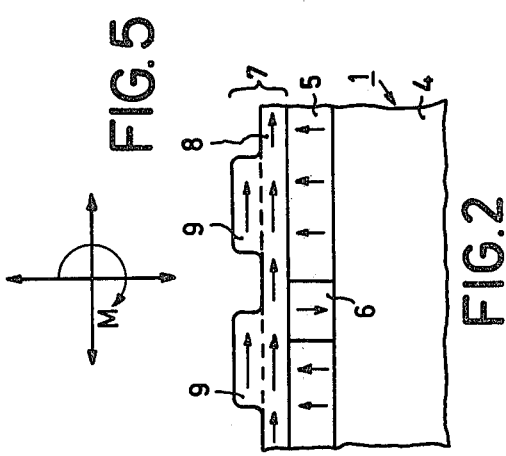

MAGNETIC BUBBLE DOMAIN STRUCTURE

BACKGROUND OF THE INVENTION

The invention relates to a magnetic bubble domain structure comprising a nonmagnetic substrate bearing a bubble domain layer of a soft magnetic material having a positive magnetic anisotropy constant. Magnetic bubble domains can be propagated in the bubble domain layer. The structure further comprises a control layer of a soft magnetic material which is superimposed on the major surface of the bubble domain layer which is remote from the substrate. The control layer defines at least one bubble domain propagation path.

Magnetic bubble domain memories generally comprise one or more memory storage loops, each of which accommodate a number of single-walled magnetic domains. Each magnetic domain represents one binary information bit. These bubble domains are rotated along the loop in a synchronized and controlled manner so as to enable one to access the stored information. See, for example, the article "Bubble memories come to the boil" by P. K. George et al, (Electronics, August 2, 1979, pp. 99–109). A number of different approaches are used in forming the bubble domain propagation paths or circuits.

In so-called "field-access" systems a path or track is usually defined by providing, on the bubble domain layer, a thin film pattern which consists of a series of geometrical forms or elements of a soft magnetic nickel-iron alloy. When an in-plane magnetic driving field is rotated, the elements are polarized successively positively and negatively for propagating or moving, step-by-step the bubble domains along the paths. Bubble domain propagation elements of nickel-iron used so far have, for example, alternate T and I shapes, alternate Y and I shapes, asymmetric chevron shapes, and C-shapes.

However, a disadvantage of the use of such nickel-iron elements is that the magnetostatic interaction ("adhesive force") between bubble domains and elements is so large that undisturbed propagation of bubble domains is possible only with strong rotating fields. This "adhesive force" is related to the fact that a bubble domain magnetizes its surroundings, notably the nickel-iron elements. This is the same effect as a permanent magnet which is laid on an iron table.

SUMMARY OF THE INVENTION

It is an object of the invention to provide a magnetic bubble domain structure in which the disturbing interaction between the bubble domains and the propagation elements does not occur so that a comparatively weak rotating field is sufficient for an undisturbed propagation of bubble domains.

This object is achieved by a bubble domain structure in which the control layer (a) has a negative magnetic anisotropy constant, and (b) comprises two sublayers. The first sublayer is continuous. The second sublayer is discontinuous and it defines at least one bubble domain propagation path for guiding the movement of bubble domains in the bubble domain layer under the influence of a variation in the orientation of a rotating magnetic field having a direction of magnetization parallel to the plane of the bubble domain layer. The first and second sublayers are superimposed one upon the other. For defining the path or paths of propagation, the discontinuous sublayer may comprise propagation elements whose shapes correspond to shape of the known nickel-iron propagation elements, for example, T and I, Y and I, C, or chevron shapes.

The operation of the bubble domain structure according to the invention is based on the fact that the rotary field magnetizes the first, continuous, sublayer of the control layer. The magnetization of the entire continuous sublayer rotates with the rotary field. By exchange coupling the magnetization of the second, discontinuous, control sublayer which defines the propagation paths is also rotated with the rotary field. The continuous sublayer functions as an amplifier, so that it is possible to use a comparatively weak rotating field. The disturbing interaction, which occurs when soft magnetic propagation elements of nickel-iron are used, is absent.

The advantages of the bubble domain structure according to the invention become more prominent as the domain dimensions become smaller. In particular the invention is very suitable for the propagation of bubble domains having a diameter of 1 $\mu$m or smaller.

According to a first preferred embodiment of the bubble domain structure according to the invention, the planar bubble domain layer and the control layer are garnet layers. With the structure, the control layer may be formed either by ion implantation of the top layer of the bubble domain layer, or by growth of a second garnet layer, having a slightly different composition from the bubble domain layer, on the bubble domain layer.

According to a second preferred embodiment, the bubble domain consists of a material having a magnetoplumbite structure, and the control layer consists of a material which combines a hexagonal crystal structure with a negative anisotropy constant.

BRIEF DESCRIPTION OF THE DRAWING

FIG. 1 is a plan view of a part of a magnetic bubble domain having a propagation structure according to the invention.

FIG. 2 is a sectional view taken on line II—II of FIG. 1.

FIG. 3 is a plan view of another embodiment of the invention.

FIG. 4 is a sectional view taken on line IV—IV of FIG. 3.

FIG. 5 is a schematic diagram of a rotating in-plane magnetic field M.

FIG. 6 is a plan view of an alternate embodiment of the invention.

FIG. 7 is a sectional view taken on line VII—VII of FIG. 6.

DESCRIPTION OF THE PREFERRED EMBODIMENTS

Reference numeral 1 in FIG. 1 denotes a part of a magnetic bubble domain structure. It comprises a pattern of Y and I-shaped elements as denoted by 2 and 2' and 3 and 3', respectively. These elements define a propagation path for a magnetic bubble domain. The structure of Y and I-shaped elements shown enables one to move domains transverse to the line II—II. However, the invention is not restricted to the use of Y and I-shaped elements. They are shown mainly for reasons of simplicity. More sophisticated elements are, for example, C-shaped elements. Whether movement takes place in the upward direction or in the downward direction depends on the sense of rotation of the rotary magnetic field M (FIG. 5) under the influence of which magnetic N and S poles are generated successively at the ends of the Y and I-shaped elements.

As shown in FIG. 2, bubble domain structure 1 comprises a substrate 4 formed by a disc which is cut from a single crystal with a given crystallographic orientation. A characteristic material for the substrate is a rare earth-gallium garnet or an equivalent material. The substrate 4 supports a planar bubble domain layer 5, for example, an epitaxially deposited rare earth-iron garnet layer having a thickness of one or a few microns and having an easy direction of magnetization in a direction perpendicular to the plane of the layer. (This means that the layer 5 has a positive magnetic anisotropy constant: $K_1 > 0$.) For illustration, a bubble domain 6 is shown in the layer 5 having a direction of magnetization opposite to that of the remainder of the layer. A control layer 7, which comprises a continuous sublayer 8 and a discontinuous sublayer 9 is present directly on top of the planar layer 5. To obtain the desired exchange coupling, the sublayers 8 and 9 preferably each have a thickness of at most 0.5 μm (a thickness of 0.2 μm is more preferable) and have an easy direction of magnetization in the plane of the layer. (This means that the layers 8 and 9 have a negative magnetic anisotropy constant: $K_2$ and $K_3 < 0$).

When bubble domain structure 1 is subjected to a rotating in-plane magnetic driving field M (assuming the usual bias field H to be present at right angles to the layer 5 so as to maintain the bubble domain 6), the following will happen. The rotating field M magnetizes the continuous sublayer 8, the whole magnetization of the sublayer 8 co-rotating with the field M. By exchange coupling, the parts of the discontinuous sublayer 9 which form the propagation elements are also co-rotated. The sublayer 9 generates magnetic poles analogous to those of known propagation structures of soft magnetic nickel-iron alloys. The interfering interaction between bubble domain and propagation element ("adhesion") which results from soft magnetic alloys, however, is absent in this case. The sublayer 8 functions as an amplifier so that a weaker rotary field will suffice than when conventional propagation structures are used. Since more trouble is experienced from the interfering interaction as the bubble domains are smaller, the advantage of the present invention becomes more and more prominent as the bubble domain dimensions become smaller. (For propagating 1 micron bubble domains, normally a rotary field of 50 to 100 Oersted is necessary. When the invention is used, rotary fields of from 10 to 20 Oersted are sufficient.)

The structure shown in FIGS. 1 and 2 can be manufactured in various manners.

According to a first method, a bubble domain layer 5 is grown on a monocrystalline substrate 4. The upper part of layer 5 is then implanted with ions to form a control layer 7 having in-plane magnetization. The upper part of the control layer 7 is etched away locally to form propagation elements 2 and 3 and 2' and 3', which remain as islands.

For the realization of small bubble domains (cross-section 1 micron and smaller) the bubble domain material must have a very high magnetic anisotropy. In that case it is difficult to change the anisotropy constant from positive to negative by implantation.

A second method involves the direct growth of a layer with $K < 0$ on a bubble domain layer with $K > 0$. This may be done, for example, by a liquid epitaxy process, in which a bubble domain layer of nominal composition $(Y,La)_3(Fe,Ga)_5O_{12}$ is grown. In this process, the gallium content of the grown layer increases from a first value to a second value in order to obtain the reversal of the anisotropy.

Where the above methods relate to layers having garnet crystal structures, a third method relates to bubble domain layers of materials having a magnetoplumbite structure, which in themselves have a positive anisotropy constant. A characteristic material of this type is barium ferrite ($BaFe_{12}O_{19}$). Such domain layers are used, according to the invention, in combination with control layers of a material having a hexagonal crystal structure and a negative anisotropy constant. A characteristic material of this latter type is barium zinc ferrite ($Ba_2Zn_2Fe_{12}O_{22}$). For this purpose, there is provided on a suitable substrate first a thin layer of $BaFe_{12}O_{19}$ having an easy axis of magnetization perpendicular to the plane of the layer. A layer of $Ba_2Zn_2Fe_{12}O_{22}$ having an easy axis of magnetization in the plane of the layer is then provided on the $BaFe_{12}O_{19}$ layer.

In all these methods, the last step is to locally etch away material from the upper part of the control layer so as to form propagation elements.

In the bubble domain chip shown in FIGS. 1 and 2, the control layer is constructed so that the sublayer 9 with the propagation pattern is separated from the layer 5 in which bubble domains are propagated by the continuous sublayer 8. In the bubble domain chip 11 shown in FIGS. 3 and 4, the order of the sublayers is reversed. A bubble domain layer 15 provided on a substrate 14 is provided with a control layer 17 which consists of a continuous sublayer 18 having in-plane magnetization which is obtained by implanting the layer 15 throughout its surface with ions down to a depth of, for example, 0.5 micron. By deeper implantation in places which correspond to a propagation pattern consisting of elements 12, 13 12', and 13', for example down to an overall depth of 1 micron, a discontinuous sublayer 19 is obtained having propagation elements directly adjoining the bubble domain layer 15. The propagation of a bubble domain 16 in layer 15 takes place in the same manner as described above in connection with the bubble domain chip 1 shown in FIGS. 1 and 2.

In manufacturing the bubble domain chip shown in FIGS. 3 and 4, a rare earth-iron garnet layer was grown on a monocrystalline substrate 14 up to a thickness of 2 microns. The garnet layer was then ion implanted at two levels. The layer 18 (the first level) was obtained by implantation with a dose of $2 \times 10^{14}$ Ne+ ions per $cm^2$ at 100 KV. In order to obtain the recesses 19 (second level), implantation with a dose of $10^{14}$ Ne+ ions per $cm^2$ at 300–400 KV was carried out locally through apertures in a gold mask 20.

Besides being suitable for the manufacture of a continuous sublayer with a discontinuous sublayer consisting of propagation elements with intermediate spaces ("gapped propagation elements"), the method of ion implantation at two levels is also very suitable for the manufacture of a combination of a continuous sublayer with a discontinuous sublayer consisting of propagation elements without intermediate spaces ("contiguous propagation elements") as shown in FIGS. 6 and 7.

FIG. 6 shows a part of a bubble domain chip 21 having a bubble domain propagation path 22 which is formed by the circumference of overlapping propagation elements 23, 23' and 23". As shown in FIG. 7, bubble domain chip 21 comprises a monocrystalline substrate 24 on which a bubble domain layer 25 is grown. The upper part of the layer 25 is implanted with ions at two levels so as to obtain a bipartite control layer 27 according to the invention. During a first implantation step the area of the layer 27 is implanted with a dose of, for example, $10^{14}$ Fe+ ions per $cm^2$ so as to form a continuous sublayer 28 with in-plane magnetization. During a second implantation step the layer 25 is implanted with the same dose down to a larger depth via apertures 32 and 33 in a thin gold mask 30 and 31 (200 nm thick) provided after the first step. The second implantation forms a discontinuous sublayer 29 with an in-plane magnetization consisting of the local recesses of the layer 28. In other words, the sublayer 29 has been formed with an in-plane magnetization and forms therein a propagation pattern of overlapping elements 23, and 23', 23" with an easy axis of magnetization in the plane of the layer. In such a configuration when the exchange coupling between the sublayers 28 and 29 does not dominate, so-called charged walls can be formed under the influence of an in-plane magnetic field. These walls emanate radially from the circumference of the propagation elements. When the bubble domain chip 21 is subjected to an in-plane rotary field M (FIG. 5) the charged walls co-rotate so that bubble domain 26 is also propagated.

In itself this does not differ from what happens in so-called contiguous disc bubble domains (see for example IEEE Transactions on Magnetics, Vol. MAG. 13, No. 6, November 1977, pp. 1744-64). However, the unique continuous sublayer 28 with in-plane magnetization of the inventive bubble domain structure ensures that the range of the charged walls is restricted so that the propagation of bubble domains along an adjacent bubble domain path 34 is not disturbed, not even when it is closed. In the known contiguous disc bubble domain devices, the charged walls have a large range so that the bubble domain path cannot be located very close together.

What is claimed is:

1. A magnetic bubble domain structure comprising:
    a nonmagnetic substrate;
    a substantially planar bubble domain layer on the substrate, said layer having a major surface opposite the substrate, said layer comprising a soft magnetic material in which magnetic domains can be propagated, said material having a positive magnetic anisotropy constant; and
    a control layer on the major surface of the bubble domain layer, said control layer comprising a soft magnetic material which defines at least one bubble domain propagation path;
CHARACTERIZED IN THAT the control layer has a negative anisotropy constant, said control layer further comprising:
    a first, continuous sublayer; and
    a second, discontinuous sublayer which defines at least one bubble domain propagation path for guiding the movement of bubble domains under the influence of a magnetic field having a rotating field component parallel to the plane of the bubble domain layer, said first and second sublayers being substantially parallel to the plane of the bubble domain layer.

2. A bubble domain structure, as claimed in claim 1, CHARACTERIZED IN THAT the bubble domain layer and the sublayers of the control layer are made of magnetic garnet materials.

3. A bubble domain structure as claimed in claim 2, CHARACTERIZED IN THAT the control layer is an ion-implanted garnet material, said garnet having the same composition as the bubble domain layer.

4. A bubble domain structure as claimed in claim 2, CHARACTERIZED IN THAT the control layer is a garnet material having a different composition as compared to the bubble domain layer.

5. A bubble domain structure as claimed in claim 1, CHARACTERIZED IN THAT:
    the bubble domain layer consists essentially of a material having a magnetoplumbite crystal structure; and
    the control layer consists essentially of a material having a hexagonal crystal structure with a negative magnetic anisotropy constant.

* * * * *